United States Patent [19]

Hill et al.

[11] Patent Number: 4,717,444
[45] Date of Patent: Jan. 5, 1988

[54] METHOD FOR MAKING HIGH-PURITY, ESSENTIALLY CRACK-FREE CRYSTALS

[75] Inventors: Fred W. Hill; Michael R. Vince, both of Thousand Oaks, Calif.

[73] Assignee: Hughes Aircraft Company, Los Angeles, Calif.

[21] Appl. No.: 771,878

[22] Filed: Sep. 3, 1985

[51] Int. Cl.$^4$ .............................................. C10B 15/10
[52] U.S. Cl. .................................. 156/624; 156/616 R; 156/DIG. 70; 156/DIG. 71; 156/DIG.83; 156/DIG. 92; 422/241
[58] Field of Search ................... 156/616 R, DIG. 70, 156/DIG. 71, DIG. 92, DIG. 83, 624; 422/241

[56] References Cited

U.S. PATENT DOCUMENTS 1,986,196  1/1935  Grosse ............................... 422/241
4,465,546  8/1984  Fitzpatrick et al. ........ 156/DIG. 92
4,528,163  7/1985  Albrecht ..................... 156/DIG. 83
4,624,735  11/1986 Kayama et al. ............ 156/DIG. 83

FOREIGN PATENT DOCUMENTS 2706143  8/1978  Fed. Rep. of Germany .
0141535  5/1980  German Democratic Rep. .
0020387  2/1977  Japan .
0157781  12/1979 Japan .
0071900  5/1982  Japan ................................. 156/624

OTHER PUBLICATIONS

Hackh's Chemical Dictionary, Fourth Edition, Grant, McGraw Hill Book Company, p. 185.

Primary Examiner—Gregory A. Heller
Assistant Examiner—Lori S. Freeman
Attorney, Agent, or Firm—Wanda K. Denson-Low; A. W. Karambelas

[57] ABSTRACT

Disclosed is a method for making large, essentially crack-free crystals in a container coated with inert particulate silica. The particulate coating covers the interior wall of the container and prevents adhesion of the crystal to the wall and acts like a cushion to avoid cracking of the crystal or the container. It also serves as a barrier to prevent migration of impurities from the container wall into the crystal structure. The coating is formed by heating a silica-forming gaseous mixture flowing through the container, with components of this mixture either reacting to form the coating.

12 Claims, 1 Drawing Figure

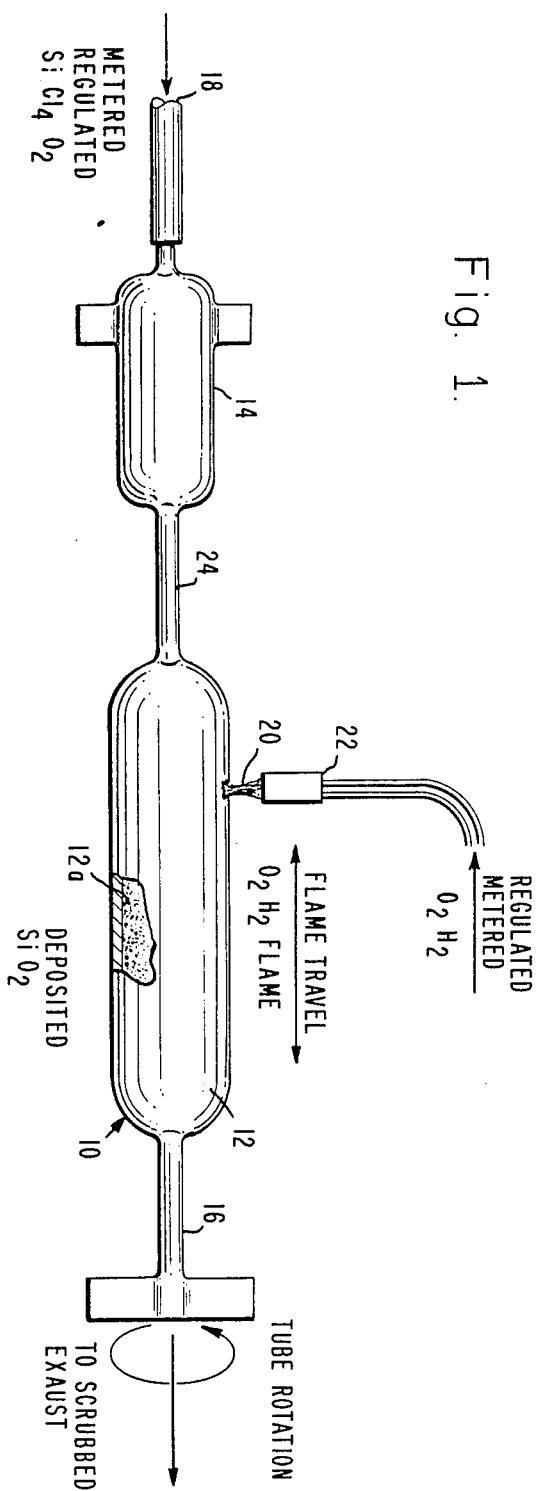

METHOD FOR MAKING HIGH-PURITY, ESSENTIALLY CRACK-FREE CRYSTALS

This invention was made under a contract with the U.S. Government and the Government has rights therein.

BACKGROUND OF THE INVENTION

1. Field of the Invention

This invention relates to a method of making high-purity, large, single crystals which are essentially crack-free.

2. Description of Related Art

Modern electronics has created a demand for high-purity crystalline materials which are the heart of the solid-state electronic systems. The demand for higher purity, larger crystals has increased as the requirements of the electronics systems have become more demanding. One problem encountered in growing such crystals is that the crystal adheres to its container as it is formed. Another problem is that impurities from the container may migrate into the crystal structure during crystal growth. Frequently, the difference in rates of expansion between the crystal material and the container also result in cracking of the container, which is usually a glass tube or crucible.

In one method used in the past, a thin coating of graphite has been deposited on the inner wall of the container. This inert, particulate material prevents migration of material from the wall into the crystal structure. It is also crushable, so that it deforms as the crystal expands. Thus, the expanding crystal will not apply excessive force to the walls of the container which may otherwise cause the container to break. The crystal, however, grows along the length of the container.

The graphite coating may be used in the formation of crystals such as silver gallium selenide, silver indium selenide, silver gallium telluride, cadmium indium telluride, cadmium telluride, and indium telluride. If, however, the desired crystalline material contains sulfur, graphite can react with the sulfur to form carbon disulfide; under the high temperatures used in crystal-forming processes, carbon disulfide may explode. Therefore, the graphite coating is employed with crystalline materials that do not include sulfur.

SUMMARY OF THE INVENTION

In accordance with the method of this invention a thin coating of silica is applied to the interior wall of the container. This coating, like graphite, serves as a barrier which prevents migration of material from the wall into the crystal structure; it also is crushable, so that the expanding crystal will not apply excessive force to the walls of the container which may otherwise cause the container to break. The crystal, however, grows along the length of the container.

This method may be used to grow a wide variety of crystals and is not limited to the specific examples disclosed herein.

When silica is used as a coating, the following are some of the crystalline materials which may be grown:
silver gallium sulfide,
cadmium sulfide,
silver sulfide,
galliuum sulfide,
zinc gallium sulfide,
cadmium gallium sulfide,
silver gallium selenide,
silver indium selenide,
silver gallium telluride,
cadmium indium telluride, and
cadmium telluride.

With the sulfide materials, the silica coating is preferred over the graphite coating because it does not form carbon disulfide.

The coating may vary in thickness, but preferably is relatively thin and will range between about 0.1 and 1.0 millimeters for most applications. This coating is formed by reacting gaseous materials flowing through the crucible in which the crystal is to be grown. It forms on the surface of the interior wall of the crucible as a layer of small particles. In the case of silica, silicon tetrachloride is one gaseous material which is reacted at elevated temperatures in the presence of oxygen to form the silica coating. The particles of silica tend to adhere to each other, i.e., they are sintered.

BRIEF DESCRIPTION OF THE DRAWING

FIG. 1 is a schematic illustration of the equipment used to coat the interior of a crystal-growing crucible with silica.

DESCRIPTION OF THE PREFERRED EMBODIMENTS

As shown in FIG. 1, a quartz crucible 10 is used having a diameter ranging between about 0.75 inches to about 2.00 inches and a length of approximately 21 inches. The wall thickness of this crucible is approximately 1.50 millimeters. A typical crucible can be purchased from Amersil corporation. Crucible 10 is disposed in a glass lathe (not shown). A suitable lathe is sold by Litton Industries.

Crucible 10 has a crystal-growing segment 12, which is heated as the crucible is rotated by the lathe. This segment 12 has two outwardly projecting sections, entry section 14 and exit section 16, which are secured in the lathe. The lathe rotates the crucible 10 at a rate of approximately 42 rpm. Entry section 14 has an open end 18 connected to a source of silicon tetrachloride ($SiCl_4$) and oxygen gas ($O_2$) with the ratio of the $SiCl_4$ to $O_2$ being in the range of 0.58 to 1.63 by volume. This gas mixture is fed through the crucible 10, flowing through it at a rate of approximately 0.465 to 0.5 liters/minute. The exterior of the crystal-growing segment 12 is heated by a traveling flame 20 from a burner 22 that is mounted to move parallel to the longitudinal axis of the crucible 10. This burner 22 moves reciprocally. A carefully metered mixture of oxygen and hydrogen is fed to the flame 20 to maintain the flame temperature at 1700° C. The silicon tetrachloride and oxygen gas mixture flows through the open end 18 of the crucible 14, then a seedholding section 24, and then into the crystal-growing segment 12. As the gas mixture impinges against the hot wall 12a of the segment 12, it reacts to form a fine powder of silica. The exhaust components of the gas leave the crucible 10 through an exit section 16 and flow into a scrubber.

The correct gas ratio, flow, temperature, rotation, flame travel and number of repeat passes are adjusted to produce the soft, crushable silica coating which adheres to the inside wall 12a of the crucible 10. The coating does not flake off, and a slight sintering occurs so that the silica coating will be physically bonded to the wall 12a. Excessively high temperatures would cause the coating to melt and are therefore avoided.

The silica coating produces a liner which enables crystals to grow in the crucible 10 and form a crack-free, high-purity, single crystal. Silver gallium sulfide is a particularly difficult crystal material to grow as a single crystal having a diameter in excess of 0.5 inch. These crystals can now be grown using the silica lined crucible described above. This silica coating not only avoids cracking of the crystal during its growth, but serves as a barrier to prevent diffusion of impurities from the crucible wall 12a into the growing crystal.

The following table sets forth representative conditions for forming a silica coating within a quartz crucible.

TABLE

| Temp.* | O$_2$ | SiCl$_4$ | Feed | Passes | RPM |
|---|---|---|---|---|---|
| 1400° C. | .34 gms/min. | .20 gms/min | 80.5 mm/min | 7 | 32 |
| 1500° C. | .42 gms/min | .45 gms/min | 80.5 mm/min | 11 | 32 |
| 1500° C. | .43 gms/min | .55 gms/min | 80.5 mm/min | 18 | 32 |
| 1600° C. | .43 gms/min | .70 gms.min | 80.5 mm/min | 14 | 32 |
| 1760° C. | .42 gms/min | .70 gms/min | 80.5 mm/min | 5 | 32 |
| 1865° C. | .42 gms/min | .70 gms/min | 80.5 mm/min | 5 | 32 |
| 1800° C. | .42 gms/min | .70 gms/min | 80.5 mm/min | 30 | 32 |

*Temperature on the surface of the quartz tube.

The quartz crucible 10 with silica coating formed in accordance with the conditions set forth in the Table is removed from the lathe and the entry section 14 is cut away from the seed holder 24. The seed holder end is then sealed off. Exit section 16 and the adjacent curved portion of crucible 10 are cut away and a seed crystal is placed in the seed holder 24. This crucible is then used to grow a crystal in accordance with, for example, the Bridgemen-Stockbarger method described in the book entitled *The Growth of Single Crystals* by R. A. Laudise, Prentice-Hall, pg. 169, 1970.

The above description presents the best mode contemplated of carrying out the present invention. The features illustrated by this embodiment provide the advantages of this invention. The invention is, however, susceptible to modifications and alternate constructions from the embodiments shown in the drawing and described above. Consequently, it is not the intention to limit it to the particular embodiments disclosed. On the contrary, the intention is to cover all modifications and alternates falling within the scope of the invention as generally expressed by the following claims.

What is claimed is:

1. A method of making a crystal comprising the step of growing the crystal in a container having interior walls limiting the crystal expansion during growth in the lateral direction, said walls being coated with inert particulate silica, wherein the particles of inert silica form a deformable coating the adheres to the surface of said walls and which aids in the preventing of cracking of crystals.

2. The method of claim 1 wherein the crystal being formed is silver gallium sulfide, cadmium sulfide, silver sulfide, gallium sulfide, zinc gallium sulfide, or cadmium gallium sulfide.

3. The method of claim 2 wherein the silica is derived from the reaction of a gas containing a mixture of oxygen and a gaseous compound of silicon.

4. The method of claim 1 wherein the crystal being formed is silver gallium selenide, silver indium selenide, silver gallium telluride, cadmium indium telluride, cadmium telluride, or indium telluride.

5. The method of claim 4 wherein the silica is derived from the reaction of a gas containing a mixture of oxygen and a gaseous compound of silicon.

6. The method of claim 1 wherein the particles of inert material have a thickness ranging between about 0.1 and 1.0 millimeters.

7. The method of claim 5 wherein the gaseous compound of silicon is SiCl$_4$.

8. A method of preparing a single crystal, comprising the steps of:
furnishing a container;
coating the inside wall of the container with a coating of crushable particulate silica, the silica being in the form of a fine powder; and
growing a single crystal in the coated container, so that the growing solid crystal is in contact with the coating of particulate silica, wherein the particles of inert silica form a deformable coating that adheres to the surface of said walls and which aids in the preventing of cracking of crystals.

9. The method of claim 8, wherein the crystal being grown is selected from the group consisting of silver gallium sulfide, cadmium sulfide, silver sulfide, gallium sulfide, zinc gallium sulfide, and cadmium gallium sulfide.

10. The method of claim 8, wherein said step of coating is accomplished by reacting a gas containing a mixture of oxygen and a gaseous silicon compound within the container, so that the particulate silica is deposited on the inside wall of the container.

11. The method of claim 10, wherein the gaseous silicon compound is SiCl$_4$.

12. The method of claim 8, wherein the coating has a thickness of from about 0.1 to about 1.0 millimeters.

* * * * *